US010811088B2

(12) United States Patent
Raj et al.

(10) Patent No.: US 10,811,088 B2
(45) Date of Patent: Oct. 20, 2020

(54) ACCESS ASSIST WITH WORDLINE ADJUSTMENT WITH TRACKING CELL

(71) Applicant: QUALCOMM Incorporated, San Diego, CA (US)

(72) Inventors: Pradeep Raj, Bangalore (IN); Rahul Sahu, Bangalore (IN); Sharad Kumar Gupta, Bangalore (IN)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/299,413

(22) Filed: Mar. 12, 2019

(65) Prior Publication Data

US 2020/0294580 A1    Sep. 17, 2020

(51) Int. Cl.
  *G11C 11/419*   (2006.01)
  *G11C 16/04*    (2006.01)
  *G11C 16/12*    (2006.01)
  *G11C 16/08*    (2006.01)

(52) U.S. Cl.
  CPC ........ *G11C 11/419* (2013.01); *G11C 16/0416* (2013.01); *G11C 16/08* (2013.01); *G11C 16/12* (2013.01)

(58) Field of Classification Search
  None
  See application file for complete search history.

(56) References Cited

U.S. PATENT DOCUMENTS

| | | | |
|---|---|---|---|
| 5,408,438 A * | 4/1995 | Tanaka | G11C 8/18 365/203 |
| 9,997,236 B1 * | 6/2018 | Pathak | G11C 11/419 |
| 10,217,506 B1 * | 2/2019 | Asthana | G11C 11/418 |
| 2012/0307574 A1 * | 12/2012 | Cheng | G11C 11/419 365/189.14 |
| 2014/0241083 A1 * | 8/2014 | Holla | G11C 11/413 365/194 |
| 2014/0241089 A1 * | 8/2014 | Holla | G11C 11/413 365/206 |
| 2016/0049191 A1 * | 2/2016 | Siddiqui | G11C 11/419 365/154 |
| 2017/0301396 A1 * | 10/2017 | Dhori | G11C 11/419 |
| 2017/0316820 A1 * | 11/2017 | Kumar | G11C 11/419 |
| 2018/0261278 A1 * | 9/2018 | Pathak | G11C 11/419 |
| 2019/0066772 A1 * | 2/2019 | Singh | G11C 11/419 |
| 2019/0221256 A1 * | 7/2019 | Kumar | G11C 11/418 |

* cited by examiner

*Primary Examiner* — J. H. Hur
(74) *Attorney, Agent, or Firm* — Qualcomm Incorporated

(57) ABSTRACT

Methods and apparatuses to adjust wordline voltage level are presented. An apparatus includes multiple memory cells arranged in multiple rows. A wordline is configured to couple to one row of the multiple rows for a read or write operation. A wordline driving circuit is configured to provide a voltage level to the wordline to facilitate the read or write operation. A tracking circuit is configured to emulate a characteristic of one of the multiple memory cells. A pull-down circuit is configured to lower the voltage level of the wordline by an amount, based on the tracking circuit, to access the one row of the multiple rows in the read or write operation. A method includes emulating a characteristic of one of multiple of memory cells and lowering a voltage level of the wordline by an amount to access one row of the multiple rows in the read or write operation.

13 Claims, 7 Drawing Sheets

US 10,811,088 B2

ACCESS ASSIST WITH WORDLINE ADJUSTMENT WITH TRACKING CELL

BACKGROUND

Field

The present disclosure relates generally to methods and apparatuses having improved access (read or write) assist with wordline voltage level adjustment and more particularly, to a memory adjusting a wordline voltage level based on a tracking circuit.

Background

A computing device (e.g., a laptop, a mobile phone, etc.) may include one or several processors to perform various functions, such as telephony, wireless data access, and camera/video function, etc. A memory is an important component of the computing device. The one processor may be couple to the memory to perform the aforementioned computing functions. For example, the one processor may fetch instructions from the memory to perform the computing function and/or to store within the memory temporary data for processing these computing functions, etc.

As demands for the computing device to perform more and better grow, the physical dimensions of the computing device—therefore of the memory—shrink. As a result, designing and building the memory are met with increasing difficulty. One such example is static noise margin (SNM) in a static random access memory (SRAM). Generally, SNM is a measure of how much noise a memory cell of the SRAM may tolerate before a value stored in the memory cells flips (i.e., an error). As semiconductor fabrication process shrinks, SNM shrinks as well. In an access of the memory cell (e.g., reading from the memory cell or writing to a different memory cell on a same row), the reduced SNM could cause the stored value to change state. An improved access scheme to the memory would therefore be advantageous.

SUMMARY

This summary identifies features of some example aspects and is not an exclusive or exhaustive description of the disclosed subject matter. Additional features and aspects are described and will become apparent to persons skilled in the art upon reading the following detailed description and viewing the drawings that form a part thereof.

An apparatus in accordance with at least one embodiment includes multiple memory cells arranged in multiple rows (and multiple columns). A wordline is configured to couple to one row of the multiple rows for a read or write. A wordline driving circuit is configured to provide a voltage level the wordline to facilitate the read or write operation. A tracking circuit configured to emulate a characteristic of one of the multiple memory cells. A pull-down circuit configured to lower the voltage level of the wordline by an amount, based on the tracking circuit, to access the one row of the multiple rows in the read or write operation.

A method to adjust to adjust a wordline to access a memory cell, in accordance with at least one embodiment, includes providing, by a wordline driving circuit, a voltage level to a wordline to facilitate a read or write operation. The multiple memory cells are arranged as the multiple rows and multiple columns. The method further includes emulating, by a tracking circuit, a characteristic of one of the multiple memory cells; and lowering, by a pull-down circuit, the voltage level of the wordline by an amount to access the one row of the multiple rows in the read or write operation, based on the tracking circuit.

BRIEF DESCRIPTION OF THE DRAWINGS

Various aspects of apparatus and methods will now be presented in the detailed description by way of example, and not by way of limitation, with reference to the accompanying drawings, wherein.

DETAILED DESCRIPTION

Figure 1:
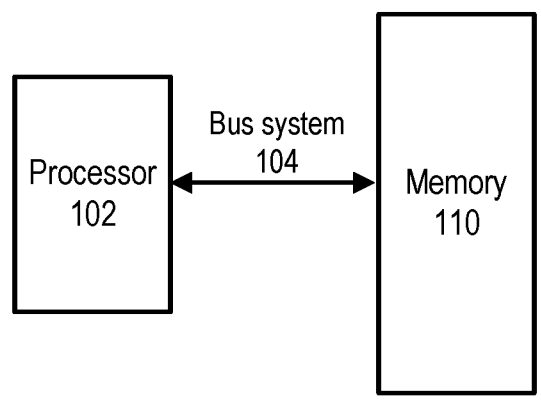
FIG. 1 illustrates an apparatus incorporating at least one processor and a memory, in accordance with certain aspects of the disclosure.

The detailed description set forth below in connection with the appended drawings is intended as a description of various configurations and is not intended to represent the only configurations in which the concepts described herein may be practiced. The detailed description includes specific details for providing a thorough understanding of various concepts. However, it will be apparent to those skilled in the art that these concepts may be practiced without these specific details. In some instances, well known structures and components are shown in block diagram form to avoid obscuring such concepts.

As used herein, the term "coupled to" in the various tenses of the verb "couple" may mean that element A is directly connected to element B or that other elements may be connected between elements A and B (i.e., that element A is indirectly connected with element B), to operate certain intended functions. In the case of electrical components, the term "coupled to" may also be used herein to mean that a wire, trace, or other electrically conductive material is used to electrically connect elements A and B (and any components electrically connected therebetween). In some examples, the term "coupled to" mean a transfer of electrical energy between elements A and B, to operate certain intended functions.

In some examples, the term "electrically connected" mean having an electric current or configurable to having an electric current flowing between the elements A and B. For example, the elements A and B may be connected via resistors, transistors, or an inductor, in addition to a wire, trace, or other electrically conductive material and components. Furthermore, for radio frequency functions, the elements A and B may be "electrically connected" via a capacitor.

The terms "first," "second," "third," etc. are employed for ease of reference and may not carry substantive meanings. Likewise, names for components/modules may be adopted for ease of reference and might not limit the components/modules. For example, such non-limiting names may include "wordline driving" circuit; "tracking" circuit; "pull-down" circuit; "charging" transistor; "pull-down" transistor; and "wordline pull-up" circuit. Modules and components presented in the disclosure may be implemented in hardware, software, or a combination of hardware and software.

The term "bus system" may provide that elements coupled to the "bus system" may exchange information therebetween, directly or indirectly. In such fashion, the "bus system" may encompass multiple physical connections as well as intervening stages such as buffers, latches, registers, etc.

Methods and apparatuses incorporating memories having improved access (e.g., read or write operations) assist with wordline adjustment are presented. The memory may be embedded with the one processor on a semiconductor die or be part of a different semiconductor die. The memory may perform various functions. For example, the memory may be used as cache, register file, or storage. The memory may be of various kinds. For example, the memory may be static random access memory (SRAM), dynamic random access memory (DRAM), magnetic random access memory (MRAM), NAND flash, or NOR flash, etc.

The memory may assist/improve access to a memory cell by adjusting a voltage level of the wordline in the read or write operation. The amount of voltage level adjusted may be based on a tracking circuit. The tracking circuit may be configured emulate certain electrical characteristics of one of multiple memory cells by, for example, mirroring or approximating the memory cell in several aspects (e.g., transistor sizing, layout of the transistors, fabrication process, location of the tracking circuit, power supply schemes, etc.). For example, the tracking circuit may emulate bitline discharge in a read access to provide sense amplifier (SA) enable timing signaling.

The tracking circuit may be configured to emulate a grounding current of a storage node storing logic zero in the memory cell. Since the amount of voltage level adjustment is based on the tracking circuit emulating the memory cell, the amount of adjustment may account for variations in process and operating condition experienced by the memory cell. In such fashion, the memory may be able to adjust the wordline voltage level taking such variations into account to improve performances (e.g., read speed and yield).

Methods and apparatuses are presented in the present disclosure by way of non-limiting example of a static random access memory (SRAM) and a read operation thereto to illustrate aspects of the tracking circuit and/or circuits adjusting the wordline voltage level. FIG. 1 illustrates an apparatus 100 incorporating at least one processor 102 and a memory 110, in accordance with certain aspects of present disclosure. The apparatus 100 may be, for example, one of computing systems (e.g., servers, datacenters, desktop computers), mobile computing device (e.g., laptops, cell phones, vehicles, etc.), Internet of Things devices, virtual reality (VR) systems, or augmented reality (AR) systems. The processor 101 may be a collection of processing logics or one or more central processing unit. FIG. 1 illustrates that the apparatus 100 incorporates the at least one processor 102 coupling to the memory 110 via a bus system 104. The at least one processor 102 and the memory 110 may be on a same semiconductor die or on different dies. The at least one processor 102 may be coupled to the memory 110 to perform a computing function, such as one of data processing, data communication, graphic display, camera, AR or VR rendering, image processing, etc. For example, the memory may store instructions or data for the at least one processor 102 to perform the aforementioned computing functions.

Figure 2:
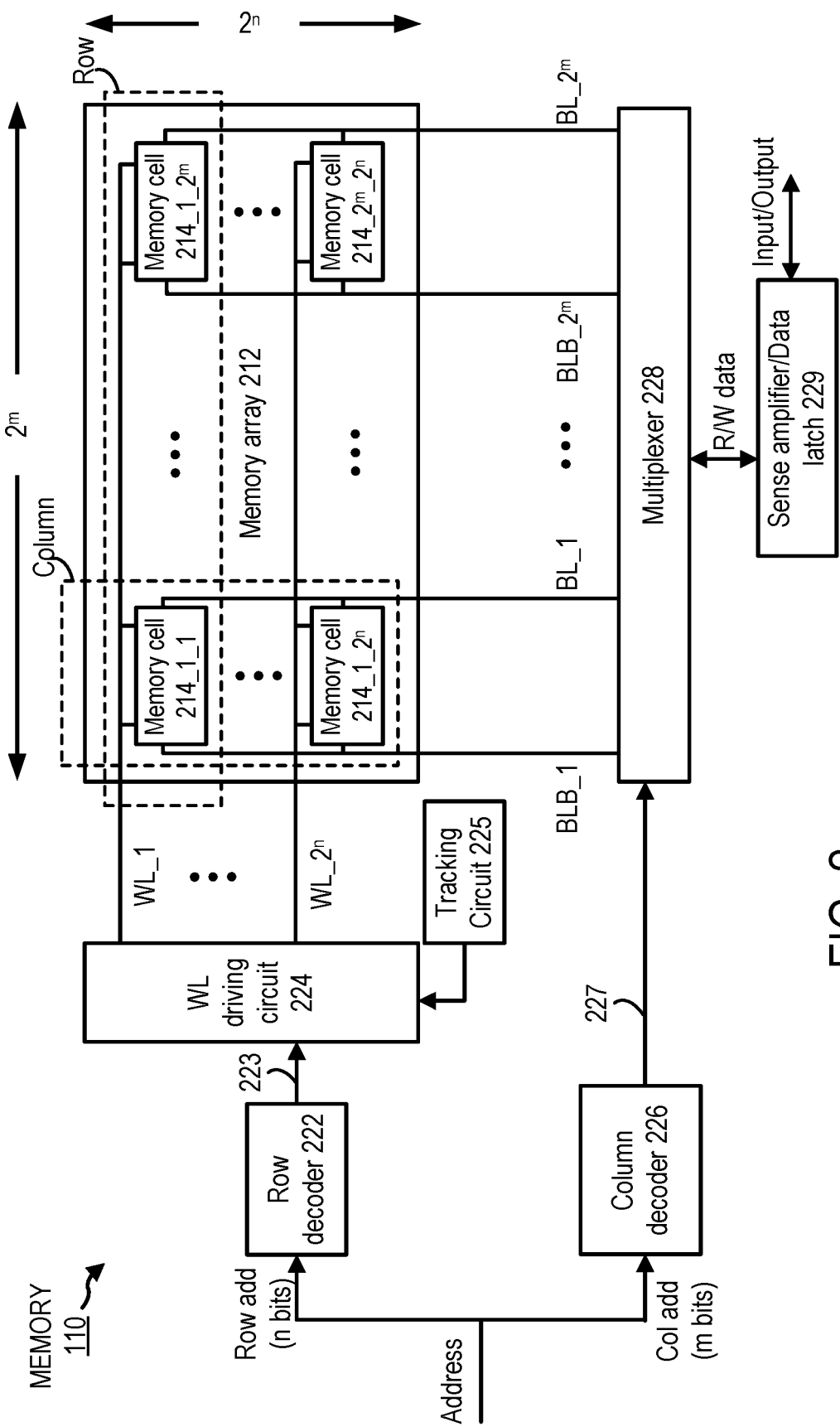
FIG. 2 illustrates functional blocks of the memory of FIG. 1, in accordance with certain aspects of the disclosure.

FIG. 2 illustrates functional blocks of the memory 110 of FIG. 1, in accordance with certain aspects of present disclosure. The memory 110 may be of various kinds. For example, the memory may be an SRAM, a dynamic random access memory (DRAM), a magnetic random access memory (MRAM), a NAND flash, or a NOR flash, etc. By way of example, the memory 110 is presented as an SRAM having a memory array 212. For illustrative purposes, the memory 110 is shown as configured as having a 1-bit access (reading or writing one bit for each access). The memory 110 may read or write multiple bits for each access (e.g., ×8, ×16, ×32). The memory array 212 includes multiple memory cells 214 (e.g., 214_1_1 to 214_2$m$_2$n$) arranged in multiple rows (labeled "row" as an example) and multiple columns (labeled "column" as an example). Each memory cells 214 may store one data bit (logic one or logic zero). As illustrated, the memory array 212 includes 2$n$ rows and 2$m$ columns. To access the memory cells 214, the memory 110 may include a row decoder 222, a wordline driving circuit 224, a column decoder 226, a multiplexor 228, and/or a sense amplifier/data latch 229.

The memory 110 receives address as input to access (e.g., to read or to write) a memory cell 214 (or memory cells 214) corresponding to the address. A row decoder 222 receives n bits of the address as row address, decodes the row address, and provides output decoded row address 223 to the wordline driving circuit 224. The wordline driving circuit 224 outputs 2$n$ wordlines (WL_1 to WL_2$n$). Each of the wordlines WL_1 to WL_2$n$ is coupled to a corresponding row of memory cells 214 to for a read or wrote operation (e.g., to enable access (read or write)) of that row. A column decoder 226 receives m bits of the address as column address, decodes the column address, and outputs decoded column address 227 to select among the 2$m$ columns of data.

Each memory cell 214 is electrically connected or coupled to a bitline pair, BL and BLB, and each column of memory cells 214 shares a same bitline pair BL and BLB. Thus, there are 2$m$ bitline pairs (e.g., BL_1 to BL_2$m$; BLB_1 to BLB_2$m$). In an access, the wordline driving circuit 224 provides (e.g., drives or effects) a voltage level onto one wordline among WL_1 to WL_2$n$, selected by the row address, to access a row of memory cells 214 coupled to the one wordline (e.g., to facilitate read or write operation to one row of memory cells 214 coupled to the one wordline). For read access, the row of memory cells 214 provides storage data onto the 2$m$ bitline pairs BL and BLB. For write access, data on the 2$m$ bitline pairs BL and BLB are written into the row of memory cells 214. In some examples, the voltage level might be adjusted by a tracking circuit 225, which is presented with FIG. 4.

The multiplexor 228 operates to select one bitline pair BLB and BLB, based on the decoded column address 227. The sense amplifier/data latch 229 amplifies and stores read data from the memory array 212, or outputs write data to the memory array 212. In a read access, the multiplexor 228 selects one bitline pair BLB and BLB and provides data on the selected bitline pair BLB and BLB, as read data, to the sense amplifier/data latch 229. The sense amplifier/data latch 229 may amplify the data on the selected bitline pair BL and BLB and output the amplified data as output of the read access. In write access, the sense amplifier/data latch 229 receives input data and outputs to the multiplexor 228 as write data. The multiplexor 228 selects one bitline pair BLB and BLB (based on the decoded column address 227) and provides the write data to the selected bitline pair BLB and BLB. In some examples, the unselected bitline pair BLB and BLB may remain at a precharged high level (may be charged or floating during the write operation).

Figure 3:
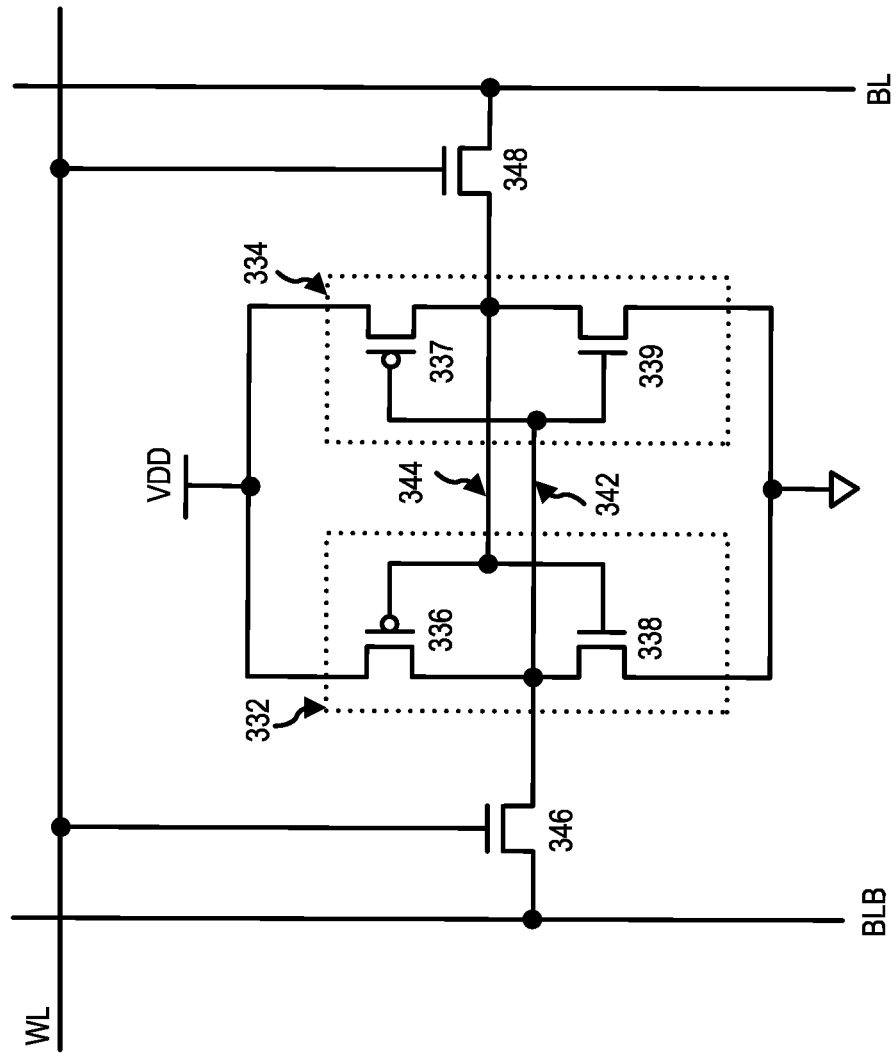
FIG. 3 illustrates a schematic representation of the memory cell of FIG. 2, in accordance with certain aspects of the disclosure.

FIG. 3 illustrates a schematic representation of the memory cell 214 of FIG. 2, in accordance with certain aspects of the present disclosure. FIG. 3 illustrates the memory cell 214 includes a p-type transistor 336, a p-type transistor 337, an n-type transistor 338, an n-type transistor 339, and access transistors 346 and 348. The memory cell 214 is powered by supply voltages VDD and ground. The memory cell 214 is configured as two, cross-coupled inverters to store data. The p-type transistor 336 and the n-type transistor 338 are configured as an inverter 332, and the p-type transistor 337 and the n-type transistor 339 are configured as an inverter 334. The inverters 332 and 334 are cross-coupled. For example, a storage node 342 is electrically connected or coupled to an output of the inverter 332 and to an input the inverter 334. A storage node 344 is electrically connected or coupled to an output of the inverter 334 and to an input of the inverter 332. The data may be stored by the storage nodes 342 and 344 (e.g., logic zero may be stored at the storage node 342 while logic one is stored at the storage node 344 and vice versa, to represent different stored values of a stored bit). In a case that logic zero is stored at the storage node 342 (and logic one is stored at the storage node 344), the n-type transistor 338 functions to keep the logic zero at the storage node 342 by keeping the storage node 342 discharged. In a case that logic zero is stored at the storage node 344 (and logic one is stored at the storage node 342), the n-type transistor 339 functions to keep the logic zero at the storage node 344 by keeping the storage node 344 discharged.

The access transistors 346 and 348 provide read or write access to the storage nodes 342 and 344, to and from a bitline pair BL and BLB, controlled by the wordline WL. The wordline WL is thus configured to enable accessing one row of the multiple rows of the memory cells 214 (FIG. 2), in a read or write operation. In FIG. 3, the access transistors 346 and 348 are n-type transistors and function as pass-gates. The wordline driving circuit 224 (FIG. 2) drives the wordline WL to a voltage level to access the memory cell 214 (e.g., provide a voltage level to the wordline WL to facilitate a read or write operation). The voltage level may be a high voltage, such as VDD, to turn on the access transistors 346 and 348 to allow a read or a write of the memory cell 214.

In a read access, both of the bitline pair BL and BLB are precharged to a high voltage level, such VDD. (Precharge circuits are not shown for clarity.) The memory cell 214 selectively pulls down one of the bitline pair BL and BLB to provide stored bit onto the bitline pair BL and BLB. For example, the storage node 342 stores logic zero (e.g., low voltage level such as ground) and the storage node 344 stores logic one (e.g., a high voltage level such as VDD). In the read access, the bitline BLB is pulled down via the access transistor 346 by the n-type transistor 338, while the bitline BL remains at the (precharged) high voltage level. Thus, a voltage difference between the bitline pair BL and BLB is produced to indicate a stored bit of the memory cell 214.

In such fashion, the bits stored by a row of memory cells 214 are provided onto the bitline pairs (BL_1, BLB_1 to BL_2m, BLB_2m), the row of memory cells 214 being coupled to a wordline (one of WL_1 to WL_2n) driven to a high voltage by the wordline driving circuit 224 (FIG. 2) for the read access. The multiplexor 228 selects one of the bitline pairs based on the decoded column address 227 from the column decoder 226 and provides the stored bit from the selected bitline pairs (e.g., in form of the voltage difference on the bitline pair BL and BLB) to the sense amplifier/data latch 229. The sense amplifier/data latch 229 amplifies the voltage difference on the bitline pair BL and BLB and outputs the result to a system outside of the memory 110 (e.g., to the at least one processor 102 via the bus system 104; see FIG. 1).

In a write access, the sense amplifier/data latch 229 receives input for write (e.g., from the at least one processor 102 via the bus system 104) and provides the input as write data to the multiplexor 228. The multiplexor 228 selects one of the bitline pairs to receive the write data, based on the decoded column address 227 from the column decoder 226. For example, the sense amplifier/data latch 229 may drive a bitline BL of the selected column to a low voltage level (e.g., ground). Referring to FIG. 3, in an example that the storage node 342 stores logic zero (e.g., low voltage level such as ground) and the storage node 344 stores logic one (e.g., a high voltage level such as VDD) prior to the write access, the BL being driven to the low voltage level would pull the storage node 344 to the low voltage level (e.g., ground or near ground) via the access transistor 348. The bit stored by the memory cell 214 may flip state. In such fashion, a different state is written into the memory cell 214.

As semiconductor fabrication process advances, static noise margin (SNM) reduces. To illustrate by way of example, the storage node 342 stores logic zero and the storage node 344 stores logic one. In a read access, the BLB is precharged to a high voltage level (such as VDD) and the wordline WL is driving to a high voltage level to enable access to the memory cell 214, charges flow from the BLB to the storage node 342 via the access transistor 346. The voltage level on the storage node 342 rises, based on a ratio of sizes between the access transistor 346 and the n-type transistor 338 pulling down the storage node 342. Should the voltage level on the storage node 342 rise above a tolerance level, the n-type transistor 339 may turn on, causing the stored bit within the memory cell 214 to flip state. Such tolerance is a measurement of SNM. In a write access, memory cells 214 in unselected columns are similarly affected.

In advanced semiconductor process, such as Fin Field-effect transistor (FinFET) process, sizes of the access transistor 346 and the n-type transistor 338 may be fixed and not easily adjustable. SNM may potentially degrade because a desirable ratio of sizes between the access transistor 346 and the n-type transistor 338 might not be implemented to provide a satisfactory SNM. Impairment in yield and proper functioning of the memory 110 of FIGS. 1 and 2 (e.g., reduced read speed) may result.

Figure 4:
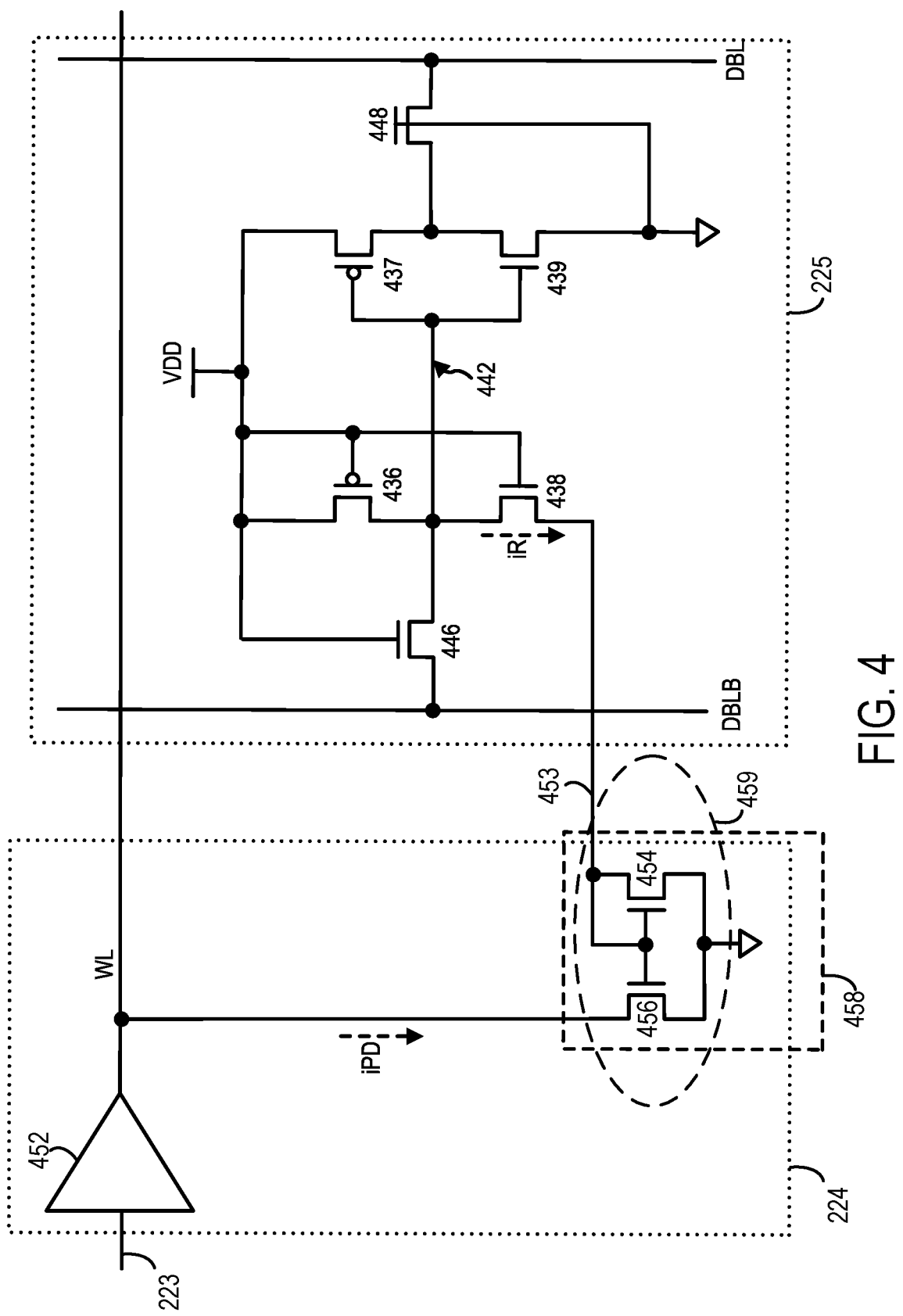
FIG. 4 illustrates a schematic representation of the wordline driving circuit and the tracking circuit of FIG. 5, in accordance with certain aspects of the disclosure.

FIG. 4 illustrates a schematic representation of the wordline driving circuit 224 and the tracking circuit 225 of FIG. 2, in accordance with certain aspects of the present disclosure. The wordline driving circuit 224 is configured to provide a voltage level to a wordline WL (e.g., to drive the wordline WL to the voltage level). To that effect, the wordline driving circuit includes a wordline pull-up circuit 452 to drive the wordline WL to the voltage level, based on the received decoded row address 223. The wordline pull-up circuit 452 may include, for example, inverter or inverters configured to provide sufficient drive strength to pull up the wordline WL to the voltage level. To improve SNM, the wordline driving circuit 224 further includes a pull-down circuit 458 configured to pull down the voltage level of the wordline WL (a scheme also known as wordline underdrive). Referring to FIG. 3, lowering the wordline voltage level in an access (e.g., a read or write operation) of the memory cell 214 has an effect of reducing current through the access transistors 346 and 348. A voltage-rise on the storage node 342 or 344 storing logic zero would be reduced, and SNM would improve accordingly. However, lowering the wordline voltage level may also reduce read or write current through the access transistors 346 and 348. With process variations, yields for memory cells 214 with marginal read or write performance would be impaired due to the reduced read or write current as a result of lowering the wordline voltage level.

To improve SNM with accounting for process variations, the memory 110 further includes a tracking circuit 225 to provide a reference signal to the pull-down circuit 458, the reference signal accounting for process variations of a memory cell 214. The tracking circuit 225 is configured to emulate one or more characteristics (physical or electrical) of one of the memory cells 214. For example, the tracking circuit 225 may be fabricated using a same process of the memory cell 214, memory cell fabrication process being typically different from a logic fabrication process. The tracking circuit 225 may physically locate near the memory array 212 (FIG. 2) such that the tracking circuit 225 may be subject to similar process variations or causes of process variations as the memory cell 214. For example, multiple tracking circuits 225 may be placed as an additional column to the memory array 212.

Moreover, sizes of transistors and loads (e.g., capacitances) on nodes of the tracking circuit 225 may be configured to emulate the memory cell 214. The tracking circuit 225 includes n-type transistors 446 and 448, which may emulate (e.g., approximate) sizes and layout of the access transistors 346 and 348 (FIG. 3) of the memory cell 214. The tracking circuit 225 further includes p-type transistors 436, 437 and n-type transistors 438, 439, which may respectively emulate sizes and layout of the p-type transistors 336, 337 and n-type transistors 338, 339 (FIG. 3) of the memory cell 214. A drain of the p-type transistor 436 and a drain of the n-type transistor 438 are electrically connected at the node 442. A gate of the p-type transistor 437 and a gate of the n-type transistor 439 are electrically connected to the node 442. The tracking circuit 225 is configured such that a load (e.g., capacitance) on the node 442 or at a drain of the n-type transistor 438 may emulate a load (e.g., capacitance) on the storage node 342 (FIG. 3) of one of the multiple memory cell 214s. Thus, the node 442 may be configured to emulate the storage node 342 of the memory cell 214 (FIG. 3).

A drain (or source) of the n-type transistor 446 and a drain (or source) of the n-type transistor 448 are electrically connected to a dummy bitline pair DBLB and DBL. A source (or drain) of the n-type transistor 446 is electrically connected to a drain of the n-type transistor 438 and a drain of the p-type transistor 436. A source (or drain) of the n-type transistor 448 is electrically connected to a drain of the p-type transistor 437 and a drain of the n-type transistor 439. The n-type transistor 448 and the dummy bitline DBL may be configured for emulation purpose (e.g., to make a structure or physical topology of the tracking circuit 225 similar to that of the memory cell 214) and provides no active functions. Accordingly, a gate of the n-type transistor 448 is configured to be at a low supply voltage (e.g., ground) to keep the n-type transistor 448 in an OFF state.

The tracking circuit 225 may be configured to emulate, at the node 442 (e.g., a drain of the n-type transistor 438), the storage node 342 of the memory cell 214 storing logic zero (e.g., a low voltage). A gate of the p-type transistor 436 and a gate of the n-type transistor 438 are configured to be at a high supply voltage (e.g., VDD) to emulate logic zero at the node 442. A size of the n-type transistor 438 may be configured to emulate (e.g., by sizing and/or placement) a transistor keeping logic zero (e.g., the n-type transistor 338) at the storage node 342 of the one of the multiple memory cells 214.

To emulate charges being provided onto the storage node 342 in an access (e.g., read or write operation) via the access transistor 346 (FIG. 3), the n-type transistor 446 may be configured as a charging transistor to provide similar charging function as the access transistor 346 (e.g., to provide charges at the drain of the n-type transistor 438 for a reference current iR through the n-type transistor 438). A size of such charging transistor (e.g., the n-type transistor 446) may be configured to emulate an access transistor (e.g., access transistor 346) of the one of the multiple memory cells 214.

For example, a gate the n-type transistor 446 is configured to be at the high supply voltage to emulate a wordline activation (driven to a high voltage level) on a gate of the access transistor 346. Thus, the charging n-type transistor 446 is in ON or conductive state. The dummy bitline DBLB may be configured to be at a high supply voltage or precharged to the high supply voltage (e.g., similar to the bitline pair BL and BLB of the memory cell 214) to provide charges to the node 442, via the charging n-type transistor 446. As a result of the configuration, the reference current iR flowing through the n-type transistor 438 maybe configured to emulate a grounding current of stored logic zero with a wordline coupled thereto at a high voltage level (e.g., a current through the n-type transistor 338 of the memory cell 214, logic zero being stored at the storage node 342). For example, the grounding current may be that of a storage node (e.g., the storage node 342) storing logic zero, in the one of the multiple memory cells 214, in the read or write operation, The pull-down circuit 458 may be configured to lower the voltage level of the wordline WL by an amount based on the tracking circuit, to access the one row of the multiple rows of the memory cells 214 (FIG. 2) in a read or write operation. To that effect, the tracking circuit 225 is further configured to output a reference signal to the pull-down circuit 458. The reference signal may be a reference current, such the reference current iR flowing through the n-type transistor 438 (emulating the grounding current of stored logic zero in the memory cell 214). A source of the n-type transistor 438 is electrically connected to the pull-down circuit 458 via a node 453 to provide the reference signal to the pull-down circuit 458.

The pull-down circuit 458 includes a current mirror 459 having an n-type transistor 456 and a second n-type transistor 454. A drain of the n-type transistor 456 is electrically connected or coupled to the wordline WL. A drain of the second n-type transistor 454 is electrically connected or coupled to the tracking circuit 225 (e.g., to the source of the n-type transistor 438), via the node 453. Thus, the pull-down circuit 458 is coupled to the source of the n-type transistor 438 to flow the reference current iR through the n-type transistor 438 and to the pull-down circuit (via the node 453). A gate of the n-type transistor 456 and a gate of the second n-type transistor 454 are electrically connected or coupled to the drain of the second n-type transistor 454. The n-type transistor 456 and the second n-type transistor 454 are thus configured as a current mirror.

The current mirror 459 may be configured to flow the reference current iR, which is based on the tracking circuit 225. The second n-type transistor 454 is arranged in series with the n-type transistor 438 for the tracking circuit 225 to flow the reference current iR through the second n-type transistor 454. The reference current iR flows through the n-type transistor 438 and through the second n-type transistor 454, via the node 453. As presented with the tracking circuit 225, a value of the reference current iR is based on a configuration of the tracking circuit 225. For example, the value of the reference current iR is based on sizes of the p-type transistor 436, of the n-type transistor 446, and/or of the n-type transistor 438 (the sizes being to emulate the memory cell 214).

In some examples, the pull-down circuit 458 may be configured to lower the voltage level of the wordline WL by an amount based on the reference current iR. The n-type transistor 456 is electrically connected or coupled to the wordline WL and functions as a pull-down transistor to discharge (e.g., to lower) the voltage of the wordline WL. The n-type transistor 456 draws a current iPD from the wordline WL, and the voltage discharged from the wordline WL is based on the current iPD. Since the n-type transistor 456 (e.g., the pull-down transistor) and the second n-type transistor 454 are configured as a current mirror 459, the current iPD flowing through the n-type transistor 456 is based on the reference current iR flowing through the second n-type transistor 454. For example, sizing of the n-type transistor 456 and the second n-type transistor 454 are such that the current iPD equals or is a multiple of the reference current iR.

Since the tracking circuit 225 is configured to emulate one or more physical or electrical characteristics of one of the multiple memory cells 214, the reference current iR flowing through the n-type transistor 438 may emulate or track a current flowing through the n-type transistor 338 of the memory cell 214 over process variations. For example, process variations (e.g., stronger n-type transistors) may effect a lower than normal grounding current to flow through the storage node 342 storing logic zero, with charges flowing via and provided by the access transistor 346, during an access (a read or write operation). The reference current iR flowing through the n-type transistor 438, due to the tracking circuit 225 emulating one or more physical or electrical characteristics of one of the multiple memory cells 214, may track the lower grounding current and similarly be lower. The amount of voltage level on the wordline WL lowered by the pull-down circuit 458 for the access would accordingly be reduced, given the amount being based on the reference current iR.

In such fashion, the pull-down circuit 458 may pull down the voltage level of the wordline WL by an amount based on the reference current iR of the tracking circuit 225. Since the reference current iR may emulate or track processing variations of the memory cell 214, the amount of the voltage level of the wordline WL lowered by the pull-down circuit 458 may similarly track processing variations of the memory cell 214. Accordingly, performances of the memory 110 are improved. For example, the amount of voltage level on the wordline WL lowered being reduced for process variations with slower n-type transistors would not needlessly and excessively lower a read current. Impacts on yield loss due to slower read speed would be reduced. These features are presented further with FIGS. 5 and 6.

Figure 5:
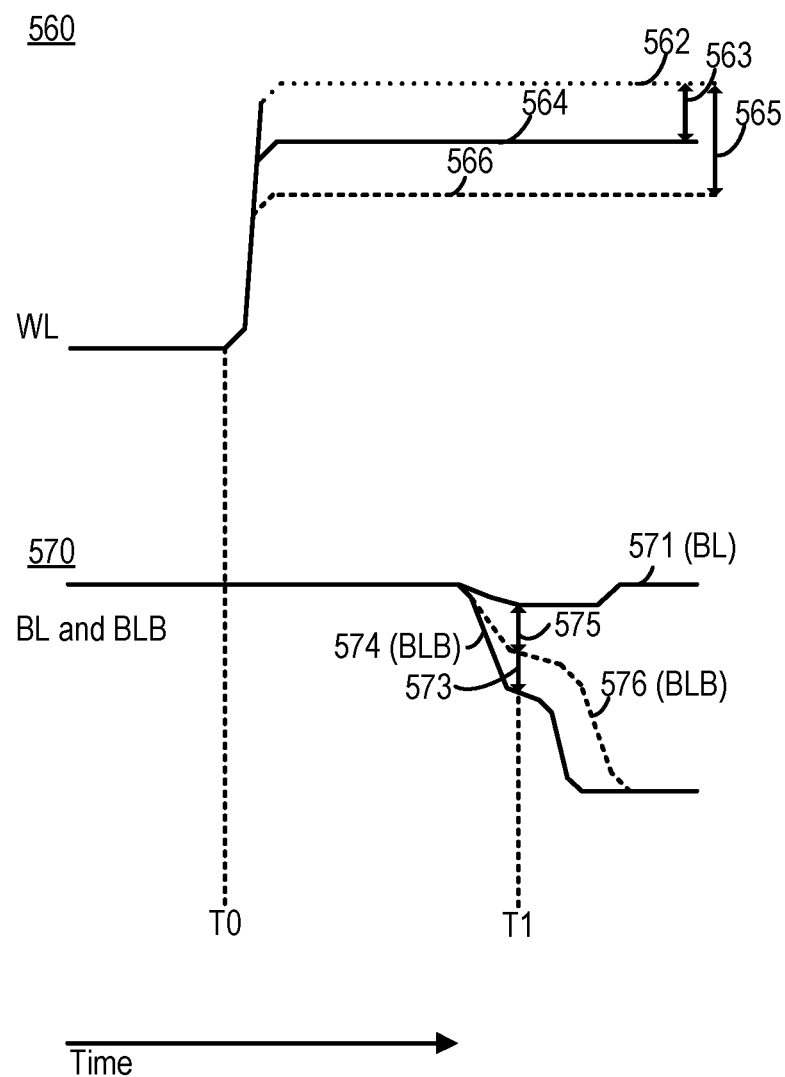
FIG. 5 illustrate waveforms of the wordline and the bitline pair in response to various operations of the pull-down circuit of FIG. 4 in a read operation, in accordance with certain aspects of the disclosure.

FIG. 5 illustrate waveforms of the wordline WL and the bitline pair BL and BLB (FIG. 3) in response to various operations of the pull-down circuit 458 of FIG. 4 in a read operation, in accordance with certain aspects of present disclosure. FIG. 5 includes a waveform 560 of the wordline WL and a waveform 570 of the bitline pair BL and BLB (both of FIG. 3), under various operations of a pull-down circuit (e.g., the pull-down circuit 458 of FIG. 4). The waveform 560 includes WL waveforms 562, 564, 566. At time T0, the WL waveform 562 illustrates the wordline driving circuit 224 of FIG. 2 providing a voltage level on the wordline WL, in response to the pull-down circuit 458 of FIG. 4 not operating (or not having a pull-down circuit operating on the wordline WL). Thus, the voltage level of the wordline WL is not pulled down or lowered.

The WL waveform 564 illustrates the voltage level of the wordline WL being lowered by an amount 563, in response to the pull-down circuit 458 of FIG. 4 operating in a process of slow n-type transistors. For example, the threshold voltage VTH of n-type transistors (e.g., the access transistors 346 and 348 of FIG. 3) may be higher than that of an average or nominal process. The WL waveform 566 illustrates the voltage level of the wordline WL being pulled down or lowered by a second amount 565, in response to the pull-down circuit 458 of FIG. 4 operating in a process of fast n-type transistors. For example, the threshold voltage VTH of n-type transistors may be lower than that of an average or nominal process. Referring to FIG. 4, the tracking circuit 225 generates a reference current iR, which emulates or tracks a grounding current of a memory cell (e.g., memory cell 214 of FIG. 3) over process variations. The reference current iR for the WL waveform 564 (slower n-type transistors) would be lower than the reference current iR for the WL waveform 566 (faster n-type transistors). As presented with FIG. 4, the pull-down circuit 458 is configured to lower the voltage level of the wordline WL based on the reference current iR. Accordingly, the amount 563 lowered (by the pull-down circuit 458) from the voltage level of the wordline WL for the WL waveform 564 is thus smaller than the second amount 565 for the WL waveform 566. In such fashion, the pull-down circuit 458 is configured to lower the voltage level of the wordline WL by an amount, based on the tracking circuit 225, to improve an access (e.g., in a read operation) of one row of the memory array 212 of FIG. 2.

The waveform 570 includes a waveform 571 for the bitline BL (see FIG. 3); a waveform 574 for the bitline BLB (see FIG. 3), the waveform 574 being in response to the WL waveform 564; and a waveform 576 for the bitline BLB, the waveform 576 being in response to the WL waveform 566. In the example, before T0, both of the bitline pair BL and BLB are precharged to, for example, a high supply voltage (VDD). The storage node 342 stores logic zero (see FIG. 3). Subsequent to the wordline WL going high, at time T1, in a read operation, a voltage difference develops on the bitline pair BL and BLB. The bitline BLB is pulled low (discharged) via the access transistor 346 and the n-type transistor 338 (see FIG. 3). The bitline BL remains at a high voltage in the read operation. Referring to FIG. 2, the sense amplifier/data latch 229 reads the value stored in the memory cell 214 by amplifying the voltage difference, for example, at the time T1. In a case the voltage difference on the bitline pair BL and BLB is too small at T1, the read might fail, or the sensing might need to be delayed. The voltage difference on the bitline pair BL and BLB thus impacts read speed and/or yield.

The wordline WL at the WL waveform 554 (slower n-type transistors) is higher than the wordline WL at the WL waveform 556 (faster n-type transistors). In other words, an amount 563 lowered from a voltage level of the wordline WL is lower than the second amount 565 lowered from the voltage level of the wordline WL. The waveform 574 illustrates that the bitline BLB is pulled low faster than the waveform 576, in response to the WL waveform 564 being higher than the WL waveform 566. Thus, at the time T1, a voltage difference 573 (between the bitline BL and the waveform 574 of the bitline BLB) is greater than a voltage difference 575 (between the bitline BL and the waveform 576 of the bitline BLB). Accordingly, since the pull-down circuit 458 is configured to track process variations of the memory cell 214, the read performance is maintained or even improved for slower n-type transistors.

Figure 6:
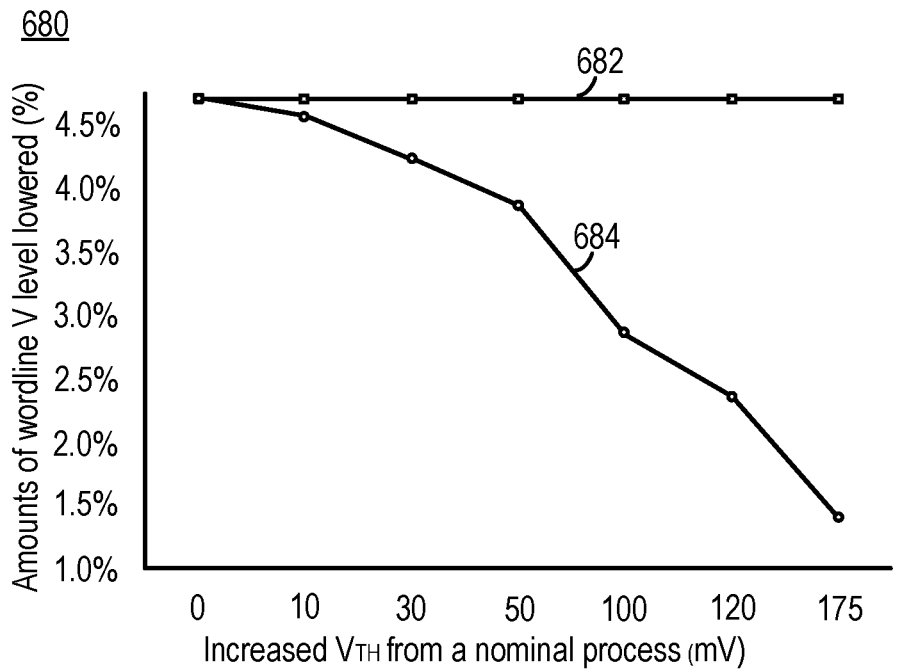
FIG. 6 illustrates performance improvement, in terms of voltage differences on the bitline pair BL and BLB (FIG. 3), provided by the pull-down circuit 458 of FIG. 4 in accordance with certain aspects of the present disclosure.
Figure 6:
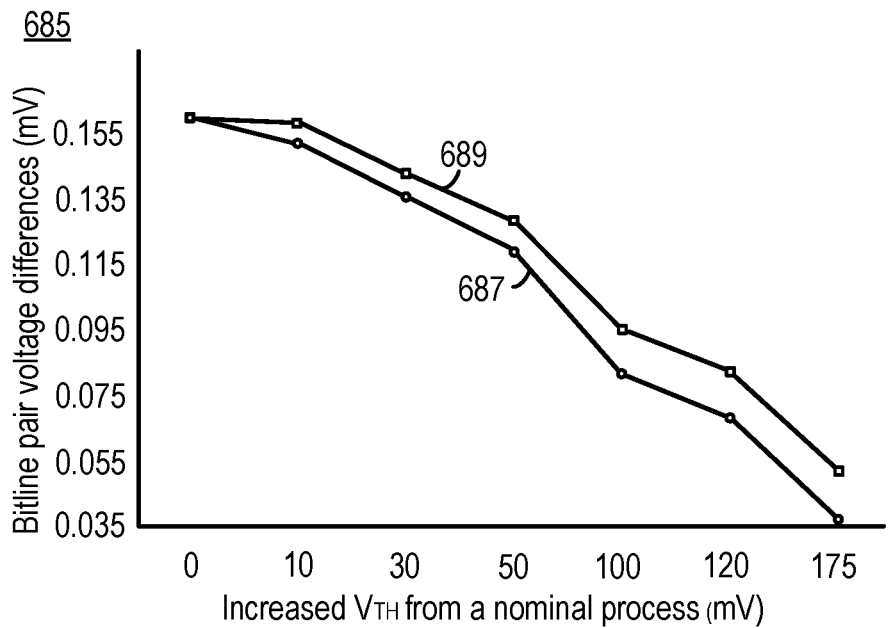

FIG. 6 illustrates performance improvement, in terms of voltage differences on the bitline pair BL and BLB (FIG. 3), provided by the pull-down circuit 458 of FIG. 4 in accordance with certain aspects of the present disclosure. FIG. 6 includes a chart 680 comparing amounts of voltage level of the wordline WL (FIG. 3) pulled down and a chart 685 comparing voltage differences of the bitline pair BL and BLB (FIG. 3), in an access (e.g., a read operation) of the memory cell 214 (FIG. 3). For both the chart 680 and the chart 685, the X-axis is the increasing VTH of n-type transistors (e.g., increasingly slower n-type transistor process variations) in mV. The increases range from zero (e.g., a nominal n-type transistor process) to 175 mV.

At the chart 680, a Y-axis illustrates amounts lowered from a voltage level of the wordline WL, in percentage, in an access (e.g., a read operation) of the memory cell 214 (FIG. 3). The chart 680 compares a line 682 and a line 684. The line 682 illustrates a case that a pull-down circuit on the wordline WL is configured to lower the voltage level of the wordline WL by a fixed amount (e.g., fixed at 4.5%). The line 684 illustrates amounts lowered from the voltage level of the wordline WL by the pull-down circuit 458 of FIG. 4, as the process slows (VTH of the n-type transistors increase). For example, at an increased VTH of 175 mV, the pull-down circuit 458 of FIG. 4 lowers the voltage of the wordline WL by less by 1.5%. Thus, as the process slows and VTH of n-type transistors increases, the pull-down circuit 458 reduces the amounts lowered from the voltage level of the wordline WL.

At the chart 685, a Y-axis illustrates bitline pair voltage difference, in mV, in an access (e.g., a read operation) of the memory cell 214 (FIG. 3). The chart 685 compares a line 687 with a line 689. The line 687 illustrates bitline pair (e.g., BL and BLB of FIG. 3) voltage differences in response to the wordline of the line 682 of the chart 680, in a read operation. Thus, the line 687 corresponds to the case that the pull-down circuit on the wordline WL is configured to lower the voltage level of the wordline WL by the fixed 4.5%. The line 689 illustrates bitline pair (e.g., BL and BLB of FIG. 3) voltage differences in response to the wordline of the line 684 of the chart 680, in a read operation. Thus, the line 689 illustrates effects of the pull-down circuit 458 lowering the voltage level on the wordline WL by an amount based on the tracking circuit 225, which tracks process variations of the memory cell 214 (FIG. 3).

The chart 685 shows that the pull-down circuit 458 tracking process variations of the memory cell 214 effects greater voltage differences on a bitline pair (e.g., BL and BLB of FIG. 3), in a read access. For example, at an increased VTH of 175 mV, the line 687 shows a voltage difference of approximately 0.035 V, and the line 689 shows a voltage difference of approximately 0.055 V. Thus, as the process slows and VTH of n-type transistors increases, the pull-down circuit 458 reduces the amounts lowered from the voltage level of the wordline WL and improves voltage difference of a bitline pair, in a read access. In such fashion, the read speed or yield may be improved as the process slows.

Figure 7:
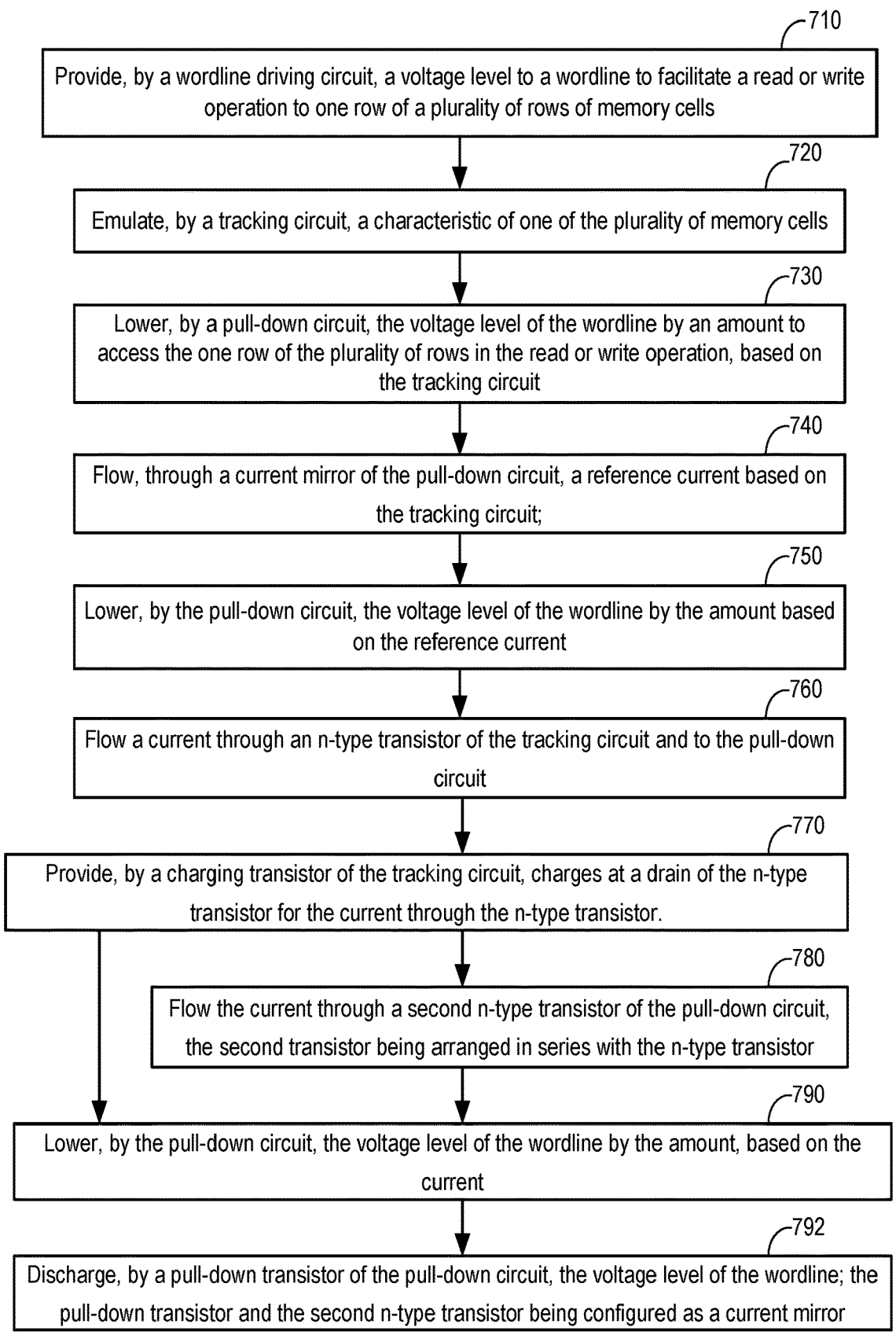
FIG. 7 illustrates a method to adjust a voltage level of a wordline, in accordance with certain aspects of the disclosure.

FIG. 7 illustrates a method to adjust a voltage level of a wordline, in accordance with certain aspects of the disclosure. The operations of FIG. 7 may be implemented by, for example, the apparatus 100 presented with FIGS. 1-4. The arrows indicate certain relationships among the operations, but not necessarily sequential relationships.

At 710, a voltage is provided by a wordline driving circuit to a wordline to facilitate a read or write operation to one row of a plurality of rows of memory cells. Referring to FIG. 2, multiple memory cells 214 is arrange as a memory array 212 having 2n rows and 2m columns. The wordline driving circuit 224 provides a voltage level (e.g., the WL waveform 562 of FIG. 5) to a wordline WL (WL_1 to WL_2n). Referring to FIG. 3, the wordline WL at the voltage level facilitates (e.g., enables) accessing the memory cell 214 in a read or write operation. For example, in a read operation, a value stored at the storage nodes 342 and 344 is outputted onto the bitline pair BLB and BL, via the access transistors 346 and 348. In a write operation, write data on the bitline pair BLB and BL are written into the storage nodes 342 and 344, via the access transistors 346 and 348. The access transistors 346 and 348 are enabled (e.g., turned on) by the wordline WL in the read or write operation.

At 720, a characteristic of one of the plurality of memory cells is emulated by a tracking circuit. For example, referring to FIG. 4, the tracking circuit 225 flows the reference current iR through the n-type transistor 438 to emulate a grounding current for a logic zero of the memory cell 214, in a read or write operation. For example, a capacitance at a drain (e.g., the node 442) of the n-type transistor 438 may emulate (e.g., configured to be approximately a same value) a capacitance of the storage node 342 of the memory cell 214. A size of the n-type transistor 438 may emulate (e.g., configured to be approximately a same value) a size of a transistor keeping logic zero (e.g., the n-type transistor 338) at the storage node 342 of the memory cell 214. A size of a charging transistor (e.g., the n-type transistor 446) may emulate (e.g., configured to be approximately a same value) a size of the access transistor 346 of the memory cell 214.

At 730, the voltage level of the wordline is lowered by a pull-down circuit by an amount to access the one row of the plurality of rows in the read or write operation, based on the tracking circuit. At 740, a reference current is flowed through the current mirror based on the tracking circuit. At 750, the voltage level of the wordline is lowered by the pull-down circuit by the amount based on the reference current. For example, referring to FIG. 4, the pull-down circuit 458 includes a current mirror 459. The reference current iR flows from the tracking circuit 225 to and through the current mirror 459 to provide a reference therefor. The current mirror 459 lowers a voltage level of the wordline WL via a current iPD, which is based on the reference current iR. The amount of voltage level of the wordline WL lowered is based on the current iPD and therefore, based on the reference current iR.

At 760, a current is flowed through an n-type transistor of the tracking circuit and to the pull-down circuit. For example, referring to FIG. 4, a source of the n-type transistor 438 of the tracking circuit 225 is electrically connected to a drain of a n-type transistor 454 (for reference, the second n-type transistor) of the current mirror 459, which is part of the pull-down circuit 458. The n-type transistor 438 and the second n-type transistor 454 are arranged in series, and the current iR flows through the n-type transistor 438 of the tracking circuit 225 to the pull-down circuit 458. In some examples, a gate of the n-type transistor 438 of the tracking circuit 225 is electrically connected to VDD to be at a high supply voltage.

At 770, charges are provided at a drain of the n-type transistor, by a charging transistor of the tracking circuit, for the current through the n-type transistor. For example, referring to FIG. 4, a charging transistor 446 of the tracking circuit 225 provides charges to the drain of the n-type transistor 438 to flow the reference current iR through the n-type transistor 438. The reference current iR through the n-type transistor 438 emulates a grounding current of a storage node 342 storing logic zero in the memory cell 214 (FIG. 3), in the read or write operation. As presented with 760, the emulation is configured by matching sizes and capacitances of the tracking circuit 225 to those of the memory cell 214.

At 780, the current is flowed through a second n-type transistor of the pull-down circuit. For example, referring to FIG. 4, the n-type transistor 438 and the second n-type transistor 454 of the pull-down circuit are arranged in series, and the current iR flows through the n-type transistor 438 of the tracking circuit 225 and the second n-type transistor 454 of the current mirror 459 of the pull-down circuit 458.

At 790, the voltage level of the wordline is lowered by the pull-down circuit by the amount, based on the current. At 792, the voltage level of the wordline is discharged by a pull-down transistor of the pull-down circuit. The pull-down transistor and the second n-type transistor are configured as a current mirror. For example, referring to FIG. 4, a pull-down transistor 456 of the pull-down circuit 458 is coupled (e.g., electrically connected) to the wordline WL to discharge (e.g., to pull down) the voltage level of the wordline WL. The pull-down circuit 458 and the second n-type transistor 454 are configured as the current mirror 459. For example, a gate of the pull-down circuit 458 and the second n-type transistor 454 are electrically connected. A source and a drain of the second n-type transistor 454 are electrically connected. Thus, a current iPD flowing through the pull-down circuit 458 is based on the current iR flowing through the n-type transistor 438 of the tracking circuit 225. The amount of the voltage level of the wordline WL lowered by the pull-down circuit 458 is based (e.g., determined) by the current iPD.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. An apparatus, comprising:
    a plurality of memory cells arranged in a plurality of rows;
    a wordline configured to couple to one row of the plurality of rows for a read or write operation;
    a wordline driving circuit configured to provide a voltage level to the wordline to facilitate the read or write operation;
    a tracking circuit configured to emulate a characteristic of one of the plurality of memory cells; and
    a pull-down circuit configured to lower the voltage level of the wordline by an amount based on the tracking circuit, to access the one row of the plurality of rows in the read or write operation,
    wherein the tracking circuit comprises:
        an n-type transistor, and
        a gate of the n-type transistor being at a high supply voltage,
    wherein the pull-down circuit is coupled to a source of the n-type transistor to flow a current through the n-type transistor and to the pull-down circuit,
    wherein the tracking circuit further comprises:
        a charging transistor configured to provide charges at a drain of the n-type transistor for the current through the n-type transistor, and
        the current through the n-type transistor being configured to emulate a grounding current of a storage node storing logic zero in the one of the plurality of memory cells, in the read or write operation.

2. The apparatus of claim 1, the pull-down circuit comprising a current mirror.

3. The apparatus of claim 2,
    the current mirror being configured to flow a reference current based on the tracking circuit,
    the pull-down circuit being configured to lower the voltage level of the wordline by the amount based on the reference current.

4. The apparatus of claim 1,
    a capacitance at the drain of the n-type transistor being configured to emulate a capacitance of a storage node of the one of the plurality of memory cells,
    a size of the n-type transistor being configured to emulate a size of a transistor keeping logic zero at the storage node of the one of the plurality of memory cells, and
    a size of the charging transistor being configured to emulate a size of an access transistor of the one of the plurality of memory cells.

5. The apparatus of claim 1, wherein the pull-down circuit comprises a second n-type transistor arranged in series with the n-type transistor to flow the current through the second n-type transistor, and the pull-down circuit is configured to lower the voltage level of the wordline by the amount, based on the current.

6. The apparatus of claim 5, wherein the pull-down circuit further comprises a pull-down transistor coupled to the wordline to discharge the voltage level of the wordline, the pull-down transistor and the second n-type transistor being configured as a current mirror.

7. The apparatus of claim 6, further comprising one of a computing system, an Internet of Things device, a virtual reality system, or an augmented reality system incorporating a processor and the plurality of memory cells, the wordline, the wordline driving circuit, the tracking circuit, and the pull-down circuit, the processor being coupled to the plurality of memory cells to perform a computing function.

8. A method to adjust a voltage level of a wordline to access a memory cell, comprising:
   providing, by a wordline driving circuit, the voltage level to the wordline to facilitate a read or write operation to one row of a plurality of rows of a plurality of memory cells, the plurality of memory cells comprising the memory cell;
   emulating, by a tracking circuit, a characteristic of one of the plurality of memory cells; and
   lowering, by a pull-down circuit, the voltage level of the wordline by an amount to access the one row of the plurality of rows in the read or write operation, based on the tracking circuit,
   wherein the tracking circuit comprises:
      an n-type transistor, and
      a gate of the n-type transistor being at a high supply voltage;
   wherein the method further comprises:
      flowing a current through the n-type transistor and to the pull-down circuit,
      providing, by a charging transistor, charges at a drain of the n-type transistor for the current through the n-type transistor, and
      wherein the current through the n-type transistor emulates a grounding current of a storage node storing logic zero, in the one of the plurality of memory cells, in the read or write operation.

9. The method of claim 8, the pull-down circuit comprising a current mirror.

10. The method of claim 9, further comprising:
   flowing, through the current mirror, a reference current based on the tracking circuit; and
   lowering, by the pull-down circuit, the voltage level of the wordline by the amount based on the reference current.

11. The method of claim 8, wherein
   a capacitance at the drain of the n-type transistor emulates a capacitance of a storage node of the one of the plurality of memory cells,
   a size of the n-type transistor emulates a size of a transistor keeping logic zero at the storage node of the one of the plurality of memory cells, and
   a size of the charging transistor emulates a size of an access transistor of the one of the plurality of memory cells.

12. The method of claim 8,
   wherein the pull-down circuit comprises a second n-type transistor arranged in series with the n-type transistor, and
   wherein the method further comprises
      flowing the current through the second n-type transistor, and
      lowering, by the pull-down circuit, the voltage level of the wordline by the amount, based on the current.

13. The method of claim 12,
   wherein the pull-down circuit further comprises a pull-down transistor coupled to the wordline, the pull-down transistor and the second n-type transistor being configured as a current mirror, and
   wherein the method further comprises:
      discharging, by the pull-down transistor, the voltage level of the wordline.

* * * * *